United States Patent
Czarnul et al.

[19]

[11] Patent Number: 5,977,818
[45] Date of Patent: *Nov. 2, 1999

[54] MULTI-INPUT TRANSISTOR CIRCUIT AND MULTI-INPUT TRANSCONDUCTANCE CIRCUIT

[75] Inventors: Zdzislaw Czarnul; Kazuhiro Tsuji, both of Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/418,447

[22] Filed: Apr. 7, 1995

[30] Foreign Application Priority Data

Apr. 8, 1994 [JP] Japan ................... 6-071057

[51] Int. Cl.$^6$ ...................................... G05F 3/02
[52] U.S. Cl. ...................... 327/543; 327/541; 327/560
[58] Field of Search ................... 326/87, 115; 327/52, 327/54, 63, 65, 69, 479, 538, 541, 543, 560, 562, 563

[56] References Cited

U.S. PATENT DOCUMENTS

| | | | |
|---|---|---|---|
| 4,533,876 | 8/1985 | Haque et al. . | |
| 4,602,167 | 7/1986 | Yukawa | 327/65 |
| 4,777,472 | 10/1988 | Sauer et al. | 327/336 |
| 4,825,110 | 4/1989 | Yamaguchi et al. | 327/52 |
| 4,845,681 | 7/1989 | Vu et al. | 326/115 |
| 5,194,765 | 3/1993 | Dunlop et al. | 326/87 |
| 5,391,979 | 2/1995 | Kajimoto et al. | 327/543 |
| 5,424,663 | 6/1995 | Wong | 327/69 |
| 5,457,407 | 10/1995 | Shu et al. | 326/87 |
| 5,469,104 | 11/1995 | Smith et al. | 327/491 |
| 5,506,541 | 4/1996 | Herndon | 327/543 |

FOREIGN PATENT DOCUMENTS

| | | | |
|---|---|---|---|
| 58-207713 | 12/1983 | Japan . | |
| 2-233018 | 9/1990 | Japan | 326/87 |

OTHER PUBLICATIONS

IEEE Journal of Solid State Circuits, vol. sc–22, No. 2, pp. 287–293, Apr. 1987, E. Sackinger, et al., "A Versatile Building Block: The CMOS Differential Difference Amplifier".

*Primary Examiner*—Terry D. Cunningham
*Attorney, Agent, or Firm*—Oblon, Spivak McClelland, Maier & Neustadt, P.C.

[57] ABSTRACT

A multi-input transistor circuit including a plurality of input MOS transistors having gates each serving as an analog voltage input terminal, operating in a non-saturation area and connected in parallel; and circuit for providing a constant drain/source voltage for each of the input MOS transistors, and having a current output point. A multi-input transconductance circuit including first and second MOS transistor groups having gates serving as first and second analog voltage input terminals, respectively, operating in a non-saturation area and connected in parallel; and a circuit for providing constant drain/source voltage for the transistors in each group and connected to a common source connecting point of each of the first and second MOS transistor groups, and having first and second current output terminals. The multi-input transistor and the multi-input transconductance circuit exhibit input-to-output linearity, have a wide dynamic range and are equivalent to an n-gate transistor.

4 Claims, 6 Drawing Sheets

MULTI-INPUT TRANSISTOR CIRCUIT AND MULTI-INPUT TRANSCONDUCTANCE CIRCUIT

BACKGROUND OF THE INVENTION

1. Field of the Invention

The present invention relates generally to a multi-input transistor and a multi-input transcondutor circuit and, more particularly, to a multi-input transistor and a multi-input transconductor circuit tliat are suited to a signal processing system.

2. Description of the Related Background Art

A multi-input element having a plurality of inputs is employed in a variety of fields ranging from an analog/digital mixing signal processor for performing not only a simple logic operation and a comparison but also a multiplication and an addition. In such a mixing signal processor, it is desired that ratio of the gains between any inputs and outputs should be realized with high accuracy. A transconductor circuit capable of obtaining a current output with respect to a plurality of voltage inputs responds to such a demand. Further, as one example of the multi-input element, there has hitherto been employed a pseudo multi-input MOS transistor (hereinafter simply termed a multi-input MOS transistor) for causing the MOS transistors to operate as if a single MOS transistor having a multiplicity of inputs operates by combining the MOS transistors. This is also one example of the transconductor circuit.

The conventional multi-input transconductor circuit proposed is actualized typically by connecting a plurality of single-unit transconductors in parallel.

Figure 11:
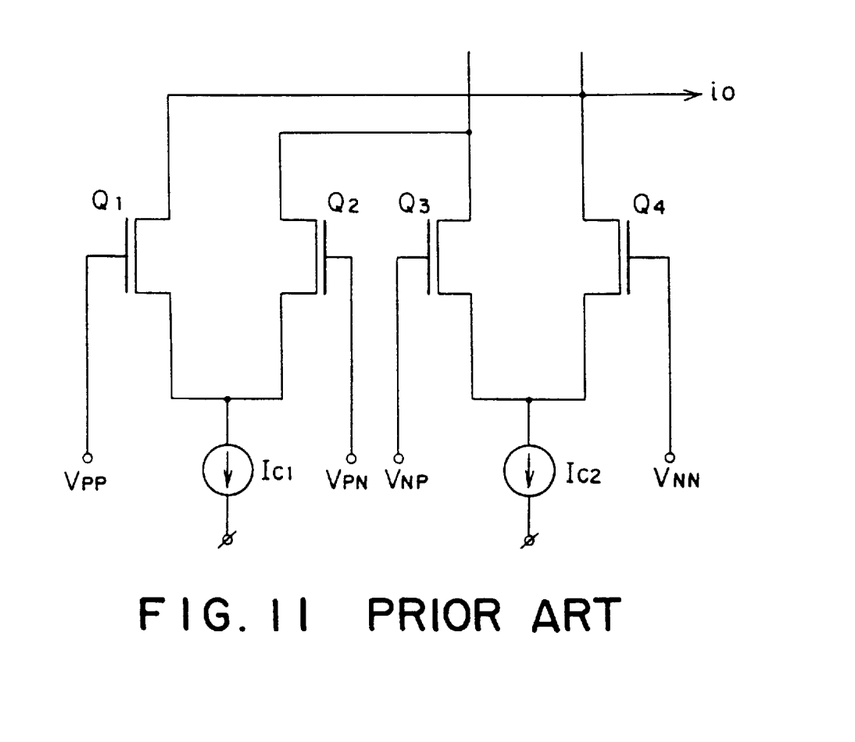
FIG. 11 is a circuit diagram showing one example of a conventional multi-input transistor.

A known single transconductor circuit is disclosed in, e.g., U.S. Pat. No. 4,749,957. The transconductor circuit in which the plurality of transconductors are connected in parallel is stated in, e.g., "A Versatile Building Block: The CMOS Differential Amplifier" written by Saeckinger and Guggenbuehl, IEEE Semiconductor Circuit Journal, Vol.22, No. 20, April 1987, wherein a plurality of differential amplifiers having absolutely the same configuration are disposed in parallel. FIG. 11 illustrates such an example. In this example, the transconductor circuit includes a first differential amplifier constructed of two N-channel MOS transistors Q1, Q2 having gates to which voltages $V_{PP}$, $V_{PN}$ are respectively applied and sources common-connected and thus connected to a current source. This transconductor circuit also includes a second differential amplifier constructed of two N-channel MOS transistors Q3, Q4 having gates to which voltages $V_{NP}$, $V_{NN}$ are respectively applied and sources common-connected and thus connected to a current source. The drains, on the correis sponding side, of the transistors Q1, Q4 and the transistors Q2, Q3 are common-connected. An output current io is obtained from the drain side of the transistor Q4.

According to the above-mentioned construction, however, the current output does not bear a proportional relationship with the input voltage, with the result that a linearity is not obtained. This is not suited to the signal processor system.

Furthermore, U.S. Pat. No. 4,533,867 discloses a two-input transconductor, wherein there is proposed an actualization of a feedback loop for consecutively adjusting an output common voltage level of the differential amplifier. There arises, however, a problem inherent in the transconductor disclosed therein, the problem being such that mutual conductances do not coincide due to a difference in threshold voltage between the transistors constituting the circuit. For this reason, a capability of dealing with the signals is restricted, and the transconductor has only a small dynamic range.

SUMMARY OF THE INVENTION

It is therefore a primary object of the present invention, which was devised to obviate the problems given above, to provide a multi-input transistor and a multi-input transconductance circuit exhibiting a good input-to-output linearity, having a wide dynamic range and equivalent to a transistor having a plurality of gates.

According to one aspect of the present invention, there is provided a multi-input transistor comprising:

plurality of input MOS transistors having gates each serving as an analog voltage input terminal, operating in a non-saturation area and connected in parallel; and means for making constant a drain/source voltage of each of said input MOS transistors, wherein a current output is taken out from a drain common connecting point of said input MOS transistor.

According to another aspect of the present invention, there is provided a multi-input transconductance circuit comprising:

a first MOS transistor group constructed of a plurality of transistors having gates each serving as an analog voltage input terminal, operating in a non-saturation area and connected in parallel;

a second MOS transistor group constructed of a plurality of transistors having gates each serving as an analog voltage input terminal, operating in the non-saturation area and connected in parallel, said second MOS transistor group including a source common connecting point connected to a source common connecting point of said first transistor group; and means for making constant a drain/source voltage of each of said transistors of said first and second MOS transistor groups, wherein a current output is taken out from the side of the drain common connecting point of each of said MOS transistor groups.

In the multi-input MOS transistor, a plurality of input MOS transistors operating in a non-saturation area are connected in parallel, and a drain/source voltage thereof is made constant. Hence, a mutual conductance ratio is a parameter ratio, and the linearity between the input current and the output current is secured.

Similarly, the multi-input transconductor circuit includes two MOS transistor groups each constructed of a plurality of MOS transistors operating in the non-saturation area and connected in parallel, and, in each group, a drain/source voltage is made constant. Accordingly, in this case also, the output current exhibiting a good linearity with respect to each analog input voltage can be obtained.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Some embodiments of the present invention will hereinafter be described in detail with reference to the drawings.

Figure 1:
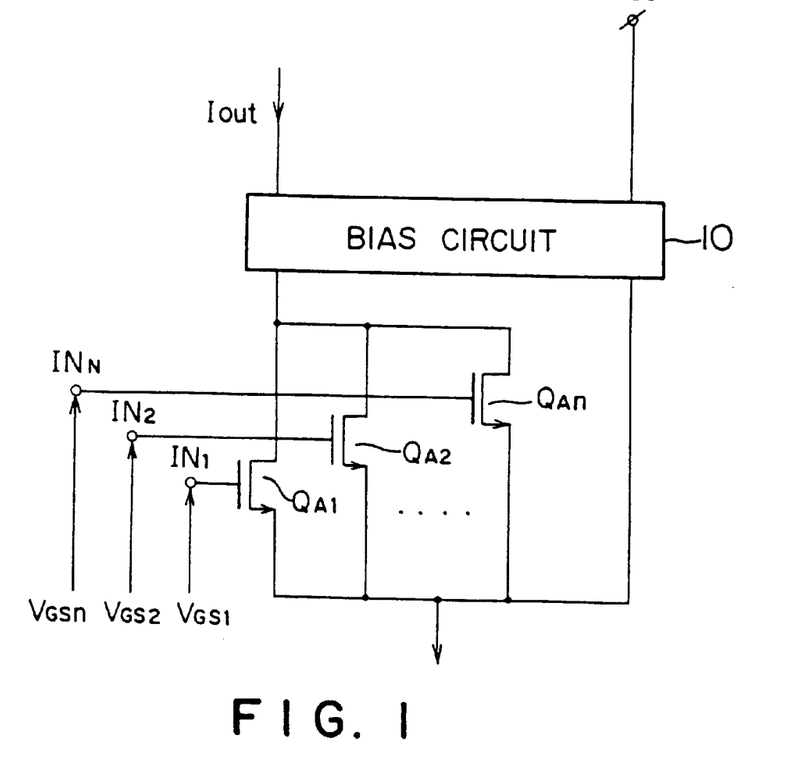
FIG. 1 is a circuit diagram illustrating a construction of a multi-input transistor according to the present invention.
Figure 2:
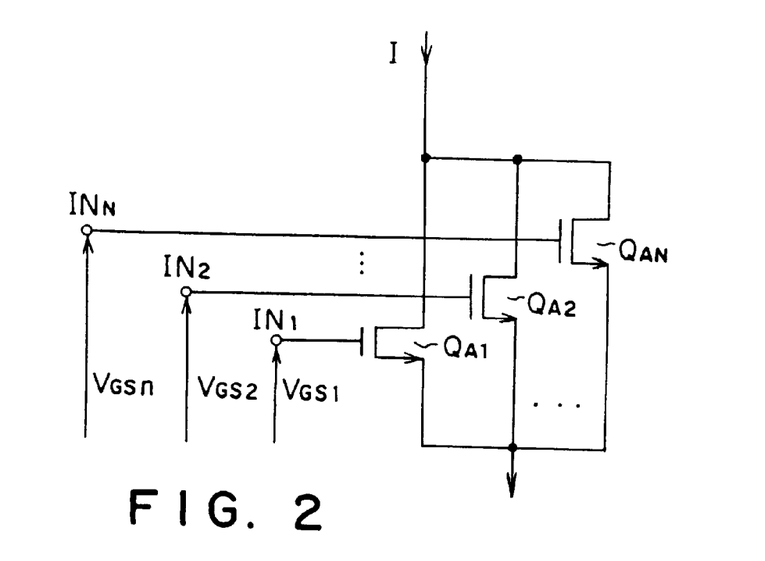
FIG. 2 is a simplified diagram of the multi-input transistor of FIG. 1.

FIG. 1 is a circuit diagram illustrating a configuration of a multi-input MOS transistor according to the present invention. FIG. 2 shows a simplified representation of FIG. 1.

Connected in parallel in this circuit are transistors QA1, QA2, ... QAn individually having geometry parameters K1, K2, ... KN and threshold values Vth1, Vth2, ... VthN and including input terminals IN1, IN2, ... INN to which analog input voltages VGS1, VGS2, ... VGSn are applied. A bias circuit 10 is provided between a common source connecting point and a common drain connecting point.

Figure 3:
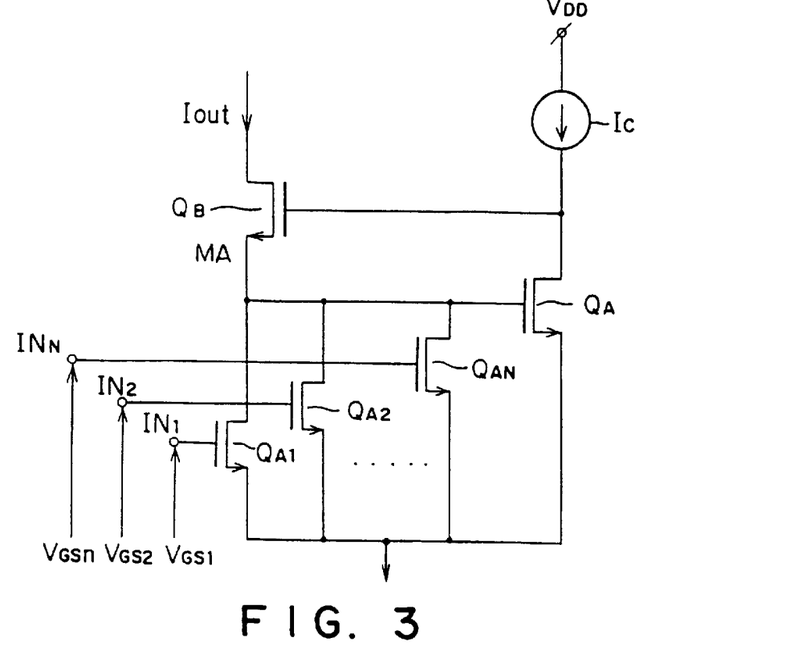
FIG. 3 is a circuit diagram of a construction of the multi-input transistor but illustrating a bias circuit in detail.

FIG. 3 illustrates a construction inclusive of one example of this bias circuit 10. The common drain connecting point of the input transistor is connected to a gate of the transistor QA. A source of this transistor QA is connected to a common source connecting point of the input transistor, and a drain thereof is connected to a current source I. Provided further is a transistor QB having a gate connected to the drain of the transistor QA, a source connected to the common drain connecting point of the input transistor and a drain serving as a current output terminal.

The operation in this circuit will be explained.

Each of the transistors QA1, QA2, ... QAn operates in a non-saturation area. That is, in each transistor, a characteristic between an input voltage and an output current is substantially expressed by:

$$IO = Ki(VGSi - Vthi - VDSi/2)VDSi \quad (1)$$

A mutual conductance gmi between the transistors is given by the following formula:

$$gmi = dIO/dVGS = Ki\, VDSi \quad (2)$$

If VDSi is a fixed equal value with respect to the transistors QA1, QA2, ... QAn, an inter-transistor mutual conductance ratio is expressed as below by using a result of the formula (2):

$$gm1:gm2: \ldots :gmn = K1:K2: \ldots :Kn \quad (3)$$

As obvious from the formula (3), the mutual conductance ratio is not dependent on the threshold value of each transistor.

Hence, an adjustment of the mutual conductance gm is actualized by a voltage VDS made constant by a feedback circuit having a constant current source IC and the transistors QA, QB shown in FIG. 3. A whole gain is thereby equalized to a gain of the transistor QB loaded by the current source IC, and a comparatively large gain is thus obtained. Further, the drain/source voltage VDS of each transistor is accurately controlled by this feedback, and, besides, an impedance at an output node drastically increases.

Note that the transistor QA is capable of operating even in a weak or strong inverted state of the transistor QB and yet operable even in a saturation or non-saturation area. Such an operating characteristic is suited particularly to the operation of the circuit supplied with a low voltage.

Figure 4:
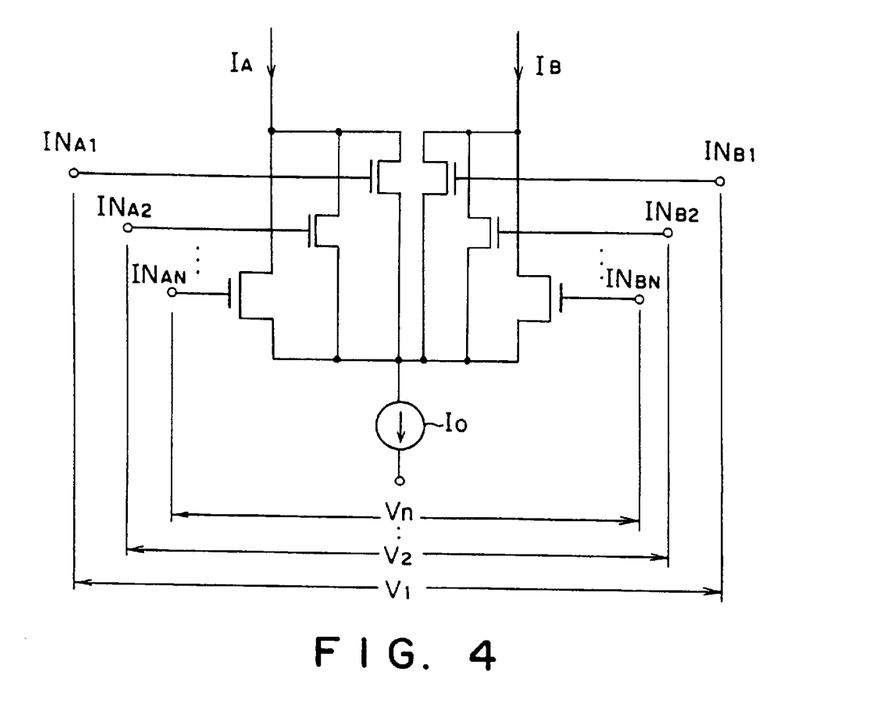
FIG. 4 is a simplified diagram in which two multi-input transistor circuits of FIG. 2 are pair-connected.

FIG. 4 is a simplified diagram in which two multi-input transistor circuits illustrated in FIG. 2 are pair-connected.

In this circuit, unlike the case of an ordinary differential MOS transistor coupling, a total input signal is assumed to be combined as many separated inputs. As far as each transistor operates in the non-saturation area, it follows that the output current is obtained in a relationship of a substantially rectilinear function relationship with respect to each of inter-input-terminal differential voltages V1(INA1-to-INB1), V2(INA2-to-INB2), ... Vn(INAN-to-INBN).

Figure 5:
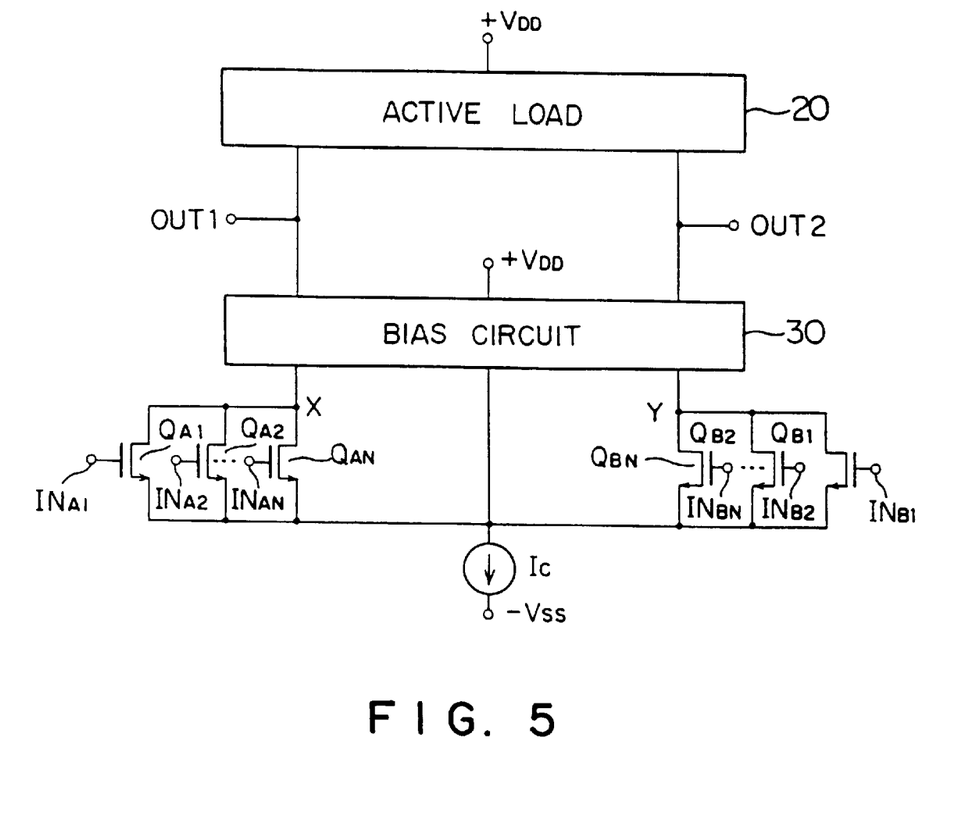
FIG. 5 is a circuit diagram showing a construction of a multi-input transconductor according to the present invention.

FIG. 5 is a circuit diagram illustrating one embodiment of the transconductor circuit according to the present invention.

This circuit has gate voltage input terminals INA1–INAN. This circuit also includes a first group of MOS transistors QA1, QA2, ... QAn constructed of a plurality of transistors having their gates serving as voltage input terminals INA1–INAN, operating in the non-saturation area and connected in parallel and a second group of MOS transistors QB1, QB2, ... QBn constructed of a plurality of transistors having their gates serving as voltage input terminals INB1–INBN, operating in the non-saturation area and connected in parallel. Source common connecting points of these MOS transistor groups are common-connected and then connected via a constant current source IC to a reference potential $-V_{ss}$. This current source is provided for enhancing a common-mode rejection ratio but is not necessarily provided if an input DC bias is fixed.

Further, a bias circuit 30 is connected to a node x serving as a drain common connecting point of the first MOS transistor group, a node y serving as a drain common connecting point of the second MOS transistor group and a constant current course $I_C$. This bias circuit 30 is connected via an active load 20 to a power supply VDD and are provided with output terminals OUT1, OUT2 for taking output currents to two connecting lines with respect to the active load 20.

Herein, the bias circuit 30 incorporates a function to make constant a voltage between the drain common connecting point (nodes x, y) and the source common connecting point of each of the MOS transistor groups and, may take configurations as shown in, e.g., FIGS. 6 through 9.

Figure 6:
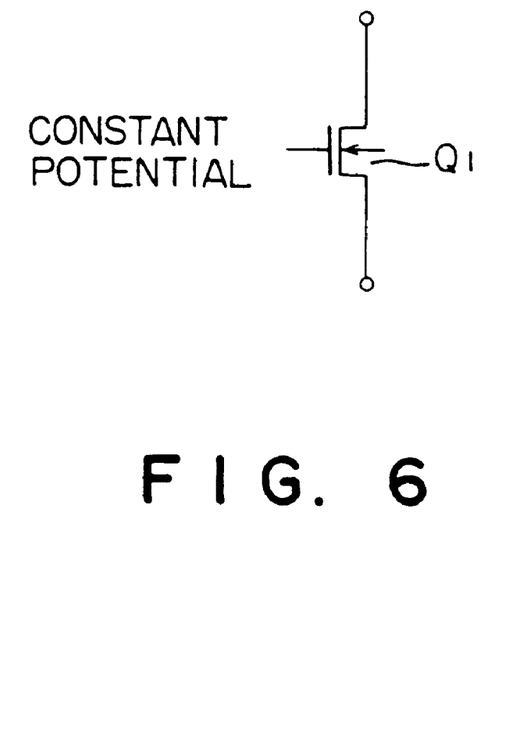
FIG. 6 is a circuit diagram showing an example of the bias circuit of FIG. 5.

FIG. 6 illustrates an N-channel MOS transistor Q1 having a gate to which a fixed potential is applied.

Figure 7:
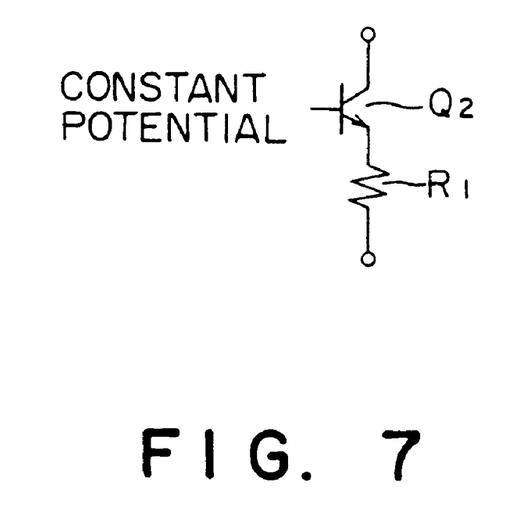
FIG. 7 is a circuit diagram showing another example of the bias circuit of FIG. 5.

FIG. 7 shows an NPN transistor Q2 having a base to which a fixed potential is applied and an emitter connected to a resistor R1.

Figure 8:
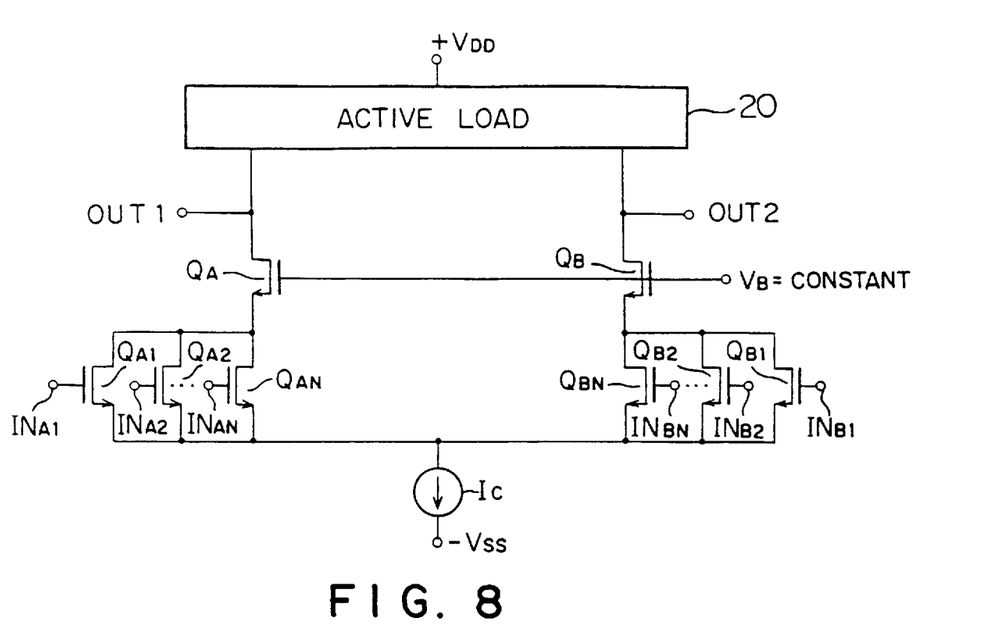
FIG. 8 is a circuit diagram illustrating an embodiment carried out by using the bias circuit shown in FIG. 6.

FIG. 8 is a circuit diagram illustrating a specific embodiment of the bias circuit using the elements shown in FIG. 6. A difference from the bias circuit of FIG. 5 is that the circuit includes a first transistor QA having a source connected to the drain common connecting point of the first MOS transistor group and a drain connected to the active load and a second transistor QB having a source connected to the drain common connecting point of the second MOS transistor group and a drain connected to the active load. Gates of these transistors QA, QB are common-connected but receive a fixed voltage VB. Note that a current output is taken out from an output terminal OUT1 provided on the drain side of the first transistor QA and from an output terminal OUT2 provided on the drain side of the second transistor QB.

According to such a construction, if the sizes of transistors QA and QB are sufficiently large, their G-S voltages are substantially the same because the constant voltage VB is commonly supplied to the gates thereof. Since the transistors QA1–QAN of a first group and QB1–QBN of a second group individually operate in the non-saturation area, voltage between common source and common drain of the first transistor group and voltage between common source and common drain of the second transistor group become substantially the same. A mutual conductance of the transconductor is substantially constant as far as the transistor operate in the non-saturation area.

Accordingly, it is possible to obtain the current output exhibiting a good linearity with respect to input voltages in a broad range by making the source/drain voltage constant. This is established in a low voltage area also. Besides, it is hard to receive an influence even if threshold voltage of transistors do not match and/or if there exists a parasitic signal in a substrate due to digital noises or the like.

Hence, this type of transconductor is capable of replacing an existing analog circuit, improving the linearity and attaining a reduction of a harmonic distortion. This transconductor is, at the same time, suitable for broad applications to a continuous time filter, an amplifier, a signal processor, a multiplier, a coder and a differential/balance analog/digital MOS system.

Further, as discussed in the embodiment of FIG. 1, each transistor mutual conductance of the MOS transistor group can be adjusted with a good controllability. That is, the source/drain voltage of the transistor in the non-saturation state is changed, or a configuration of the transistor is varied, thereby making it possible to obtain a desired mutual conductance.

Figure 9:
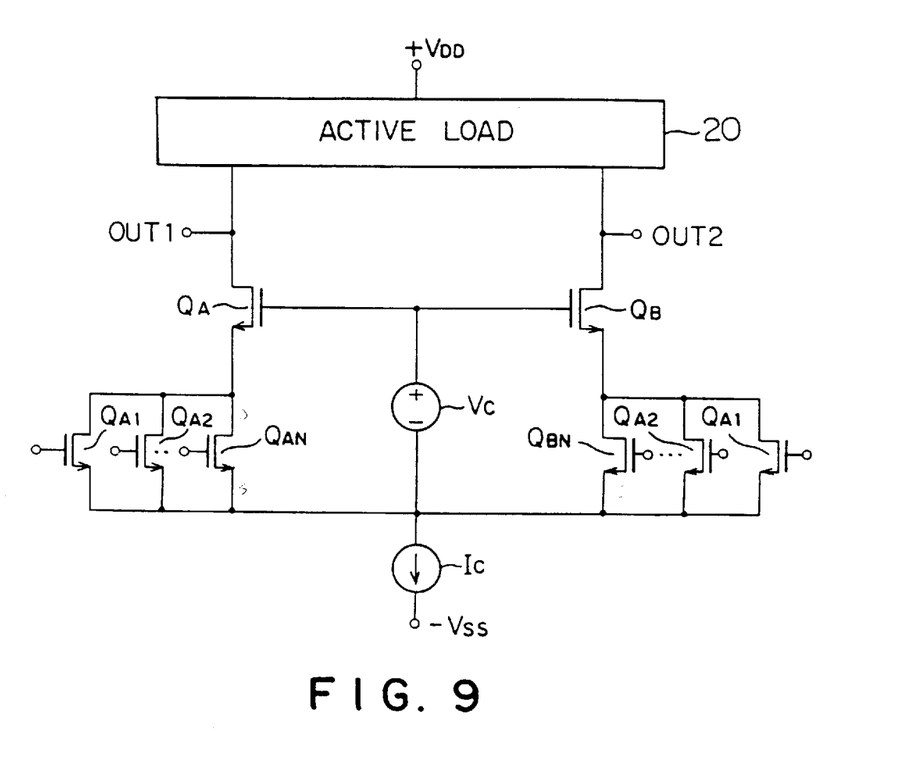
FIG. 9 is a circuit diagram illustrating an embodiment in which a constant voltage source is further provided in the embodiment of FIG. 10.

FIG. 9 illustrates a modified example of the embodiment in shown in FIG. 8. A constant voltage source Vc for generating a constant voltage applied to the gates of the transistors QA, QB in FIG. 10 is provided between of the source common connecting point of each transistor group and the gates of the transistors QA, QB.

Figure 10:
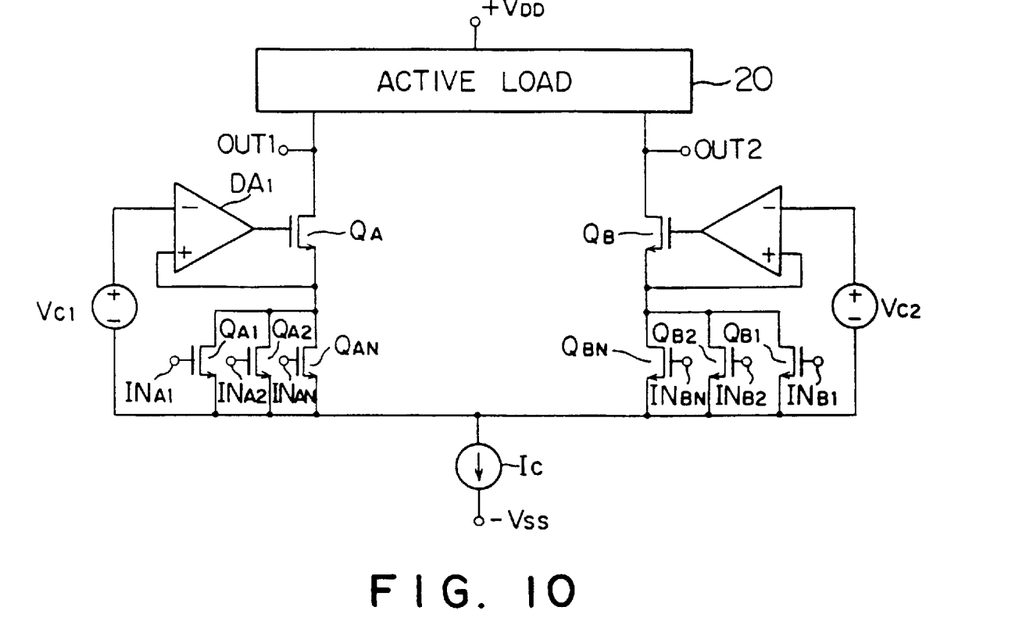
FIG. 10 is a circuit diagram illustrating an embodiment in which a drain/source voltage is made constant by use of a feedback circuit in each MOS transistor group.

FIG. 10 is a circuit diagram illustrating still another embodiment of the transconductor circuit according to the present invention. This transconductor circuit includes a feedback circuit for making constant the drain/source voltage of each MOS transistor group. More specifically, the source of the first transistor QA is connected to the drain common connecting point of the first MOS transistor group, and its drain serves as the output terminal OUT1 and is, at the same time, connected to the active load 20. An output of a differential amplifier DA1 is connected to the gate of the transistor QA. A non-inverting input terminal of this differential amplifier DA1 is connected to the drain common connecting point of the first MOS transistor group, and a constant voltage source VC1 is connected between an inverting input terminal and the source common connecting point of the first MOS transistor group. Similarly, a source of the second transistor QB is connected to the drain common connecting point of the second MOS transistor group, and its drain is serves as the output terminal OUT2 and is, at the same time, connected to the active load 20. An output of a differential amplifier DA2 is connected to the gate of the transistor QB. A non-inverting input terminal of this differential amplifier DA2 is connected to the drain common connecting point of the second MOS transistor group, and a constant voltage source VC2 is connected between the inverting input terminal and the source common connecting point of the second MOS transistor group.

Based on such a construction, the drain/source voltage of each of the MOS transistor groups is controlled constant by applying the differential voltage between the constant voltage and the drain voltage of the MOS transistor group to the gates of the transistors QA, QB, whereby the operation can be more stabilized.

According to this embodiment, the differential amplifier is constructed of the MOS transistors but may be constructed of bipolar transistors.

Throughout the respective embodiments discussed above, the mutual conductance of the transconductor is proportional to the W/L coefficient (W is the width, and the L is the length) as well as to the source/drain voltage and can be therefore adjusted with the good controllability by making most of this.

Further, in each embodiment, the MOS transistor os of the N-channel type but may be of a P-channel.

Moreover, the number of the input signals may be set arbitrarily.

As discussed above, in the multi-input transistor according to this invention, the plurality of input MOS transistors operating in the non-saturation area are connected in parallel, and the drain/source voltage thereof is made constant. The linearity between the input voltage and the output current is therefore secured with a simple construction.

The multi-input transconductor circuit according to the present invention includes the two transistor groups each constructed of the plurality of MOS transistors operating in the non-saturation area and connected in parallel. In each transistor group, the drain/source voltage is made constant, and, therefore, it is possible to obtain the output current exhibiting the good linearity with respect to each input voltage with the simple construction.

Further, when using the feedback circuit including the constant voltage source for making constant the drain/source voltage of the transistor group, the drain/source voltage can be more stabilized, and the characteristic can be also improved.

It is apparent that, in this invention, a wide range of different working modes can be formed based on the invention without deviating from the spirit and scope of the invention. This invention is not restricted by its specific working modes except being limited by the appended claims.

What is claimed is:

1. A multi-input transconductance circuit comprising:
 a first MOS transistor group including a plurality of first transistors having gates each serving as a first analog voltage input terminal, operating in a non-saturation area, drains of said plurality of first transistors being commonly connected and sources of said plurality of first transistors being commonly connected;
 a second MOS transistor group including a plurality of second transistors having gates each serving as a second analog voltage input terminal, operating in a non-saturation area, drains of said plurality of second transistors being commonly connected and sources of said plurality of second transistors being commonly connected, said sources of said plurality of first transistors and said sources of said plurality of second transistors being commonly connected; and means for providing a constant voltage across said commonly connected drains and commonly connected sources, said means for providing a constant voltage having first and second current output terminals.

2. The multi-input transconductance circuit according to claim 1, wherein said means for providing a constant voltage comprises:

a first transistor having a source connected to said commonly connected drains of said first MOS transistor group and a source serving as the first current output terminal; and a second transistor having a source connected to said commonly connected drains of said second MOS transistor group, and a drain serving as the second current output terminal, gates of said first transistor and of said second transistor being commonly connected and supplied with a constant voltage.

3. The multi-input transconductance circuit according to claim 2, wherein said means for providing a constant voltage comprises:

a constant voltage source provided between a common gate connecting point of said first and second transistors and the common source connecting points of said first and second MOS transistor groups.

4. The multi-input transconductance circuit according to claim 2, further comprising:

a first feedback circuit, including, a first differential amplifier having a non-inverting input terminal connected to the common source connecting point of said first MOS transistor group and an output terminal connected to the gate of said first transistor, and a first constant voltage source connected between the commonly connected sources of said first MOS transistor group and an inverting input terminal of said first differential amplifier; and a second feedback circuit, including, a second differential amplifier having a non-inverting input terminal connected to the common source connecting point of said second MOS transistor group and an output terminal connected to the gate of said second transistor, and a second constant voltage source connected between the commonly connected sources of said second MOS transistor group and an inverting input terminal of said second differential amplifier.

* * * * *